(12) United States Patent
Takematsu et al.

(10) Patent No.: US 9,443,779 B2
(45) Date of Patent: Sep. 13, 2016

(54) SEMICONDUCTOR DEVICE (71) Applicant: FUJI ELECTRIC CO., LTD., Kawasaki-shi (JP)

(72) Inventors: Yuji Takematsu, Hino (JP); Katsuhiko Yanagawa, Hino (JP); Kenji Okamoto, Hachioji (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/848,171

(22) Filed: Sep. 8, 2015

(65) Prior Publication Data

US 2015/0380335 A1 Dec. 31, 2015

Related U.S. Application Data (63) Continuation of application No. PCT/JP2014/069813, filed on Jul. 28, 2014.

(30) Foreign Application Priority Data

Sep. 13, 2013 (JP) .................................. 2013-190787

(51) Int. Cl.
| | |
|---|---|
| *H01L 23/48* | (2006.01) |
| *H01L 23/29* | (2006.01) |
| *H01L 25/07* | (2006.01) |
| *H01L 25/18* | (2006.01) |

(Continued)

(52) U.S. Cl.
CPC ......... *H01L 23/295* (2013.01); *H01L 23/3135* (2013.01); *H01L 24/01* (2013.01); *H01L 25/07* (2013.01); *H01L 25/18* (2013.01); *H01L 29/1608* (2013.01); *H01L 23/28* (2013.01); *H01L 23/293* (2013.01); *H01L 2924/351* (2013.01)

(58) Field of Classification Search
CPC ... H01L 23/28; H01L 23/293; H01L 23/295; H01L 23/3135; H01L 24/01; H01L 25/18; H01L 25/07

See application file for complete search history.

(56) References Cited

U.S. PATENT DOCUMENTS

| | | | |
|---|---|---|---|
| 9,051,450 B2* | 6/2015 | Ganbe | C08G 59/32 |
| 2006/0029811 A1* | 2/2006 | Sugioka | C08L 63/00 |
| | | | 428/413 |
| 2011/0084384 A1* | 4/2011 | Sakata | H01L 21/563 |
| | | | 257/737 |

(Continued)

FOREIGN PATENT DOCUMENTS

| | | |
|---|---|---|
| JP | H05-13623 A | 1/1993 |
| JP | 2010-219420 A | 9/2010 |

(Continued)

*Primary Examiner* — Nicholas Tobergte
(74) *Attorney, Agent, or Firm* — Rabin & Berdo, P.C.

(57) ABSTRACT

A semiconductor device includes a molded body obtained by sealing, with a sealing material, a member including a semiconductor element, an insulating substrate which is bonded to one surface of the semiconductor element, and a printed circuit board which is used for a connection to an external circuit and is bonded to another surface of the semiconductor element. The sealing material includes a first sealing material which is a nanocomposite resin including an epoxy base resin, a curing agent, and an inorganic filler with an average particle size of 1 nm to 100 nm; and a second sealing material which is a thermosetting resin, a thermoplastic resin, or a mixture thereof without an inorganic filler. The sealing material is less likely to be degraded by thermal oxidation, even when the semiconductor element operates at a high temperature of 175° C. or higher, is crack resistant, and has high reliability and durability.

18 Claims, 2 Drawing Sheets (51) Int. Cl.
  *H01L 23/31* (2006.01)
  *H01L 23/00* (2006.01)
  *H01L 29/16* (2006.01)
  *H01L 23/28* (2006.01)

(56) References Cited

U.S. PATENT DOCUMENTS

2012/0081864 A1* 4/2012 Sakurai ............ H01L 23/49822
                                                            361/753
2012/0146248 A1* 6/2012 Nishihata ................ C08L 63/00
                                                            257/789
2013/0105929 A1   5/2013 Ganbe et al.
2014/0124936 A1   5/2014 Yanagawa et al.

FOREIGN PATENT DOCUMENTS

| | | |
|---|---|---|
| JP | 2011-014863 A | 1/2011 |
| JP | 2012-191010 A | 10/2012 |
| JP | 2013-004729 A | 1/2013 |
| JP | 2013-087191 A | 5/2013 |
| JP | 2013-171852 A | 9/2013 |
| JP | 2014-146774 A | 8/2014 |
| WO | WO-2012/043751 A1 | 4/2012 |
| WO | WO-2012/172862 A1 | 12/2012 |

* cited by examiner

SEMICONDUCTOR DEVICE

CROSS-REFERENCE TO RELATED APPLICATIONS

This non-provisional application for a U.S. patent is a Continuation of International Application PCT/JP2014/069813 filed Jul. 28, 2014, which claims priority from JP PA 2013-190787 filed Sep. 13, 2013, the entire contents of both of which are hereby incorporated by reference.

BACKGROUND OF THE INVENTION

1. Field of the Invention

The present invention relates to a semiconductor element sealing material, and more particularly, to a semiconductor device using silicon carbide (SiC) or gallium nitride (GaN).

2. Background of the Related Art

In a semiconductor device using a silicon (Si) semiconductor element which has been generally used, sealing has been performed with epoxy resin or silicon gel to ensure insulation. SiC or GaN has better electrical characteristics than Si. Therefore, in recent years, research and development for putting the SiC or GaN semiconductor element to practical use have been conducted. The SiC or GaN semiconductor element is expected to replace the Si semiconductor element in the future. The SiC or GaN semiconductor element has better operation characteristics than the Si semiconductor element at a high temperature. In particular, SiC can operate up to 300° C.

When SiC is used in the semiconductor element, it is possible to increase the current density of the semiconductor element. However, when the current density of the semiconductor element increases, the amount of heat generated from the semiconductor element increases and the temperature of the semiconductor element increases. Therefore, it is necessary to increase the heat resistance performance of the sealing material used. When a general silicon gel according to the related art is used as the sealing material, in some cases, the silicon gel is degraded by oxidation at a high temperature of 175° C. or higher in an oxygen atmosphere and a crack occurs. In addition, when a general epoxy resin is used as the sealing material, in some cases, the resin is similarly degraded by oxidation and a crack occurs. Hereinafter, the degradation under the conditions of a high temperature and an oxygen atmosphere means thermal degradation in an oxygen atmosphere and is referred to as "thermal oxidation degradation".

In the sealing of a semiconductor element, a technique has been known which doubly seals a semiconductor element with a first resin and a second resin in terms of humidity resistance (see JP 5-13623 A, Patent Document 1). In addition, in the manufacture of a power semiconductor module, a technique has been known which covers a semiconductor element with a first sealing material layer and a second sealing material layer in order to prevent the thermal fatigue of a solder layer adjacent to the semiconductor element (see JP 2010-219420 A, Patent Document 2).

However, in known techniques, it is difficult to maintain sealing characteristics at a high temperature of, for example, 175° C. or higher in the SiC or GaN semiconductor elements which operate at a high temperature.

In order to solve the above-mentioned problems, an object of the invention is to provide a semiconductor device that uses a SiC or GaN element, includes a sealing resin which is less likely to be degraded by thermal oxidation even when the semiconductor element operates at a high temperature of 175° C. or higher, can prevent the occurrence of a crack, and has high reliability and durability.

SUMMARY OF THE INVENTION

The invention has been made in order to solve the above-mentioned problems. That is, according to an embodiment of the invention, a semiconductor device includes a molded body that is obtained by sealing, with a sealing material, a member including an insulating substrate which is bonded to one surface of the semiconductor element, and a printed circuit board which is used for connection to an external circuit and is bonded to the other surface of the semiconductor element. The sealing material includes: a first sealing material which is a nanocomposite resin including an epoxy base resin, a curing agent, and an inorganic filler with an average particle size of 1 nm to 100 nm; and a second sealing material which is a thermosetting resin, a thermoplastic resin, or a mixture thereof.

In the semiconductor device, the first sealing material may form a first sealing layer that covers the semiconductor element and is provided in a region adjacent to the semiconductor element and the second sealing material may form a second sealing layer that covers the first sealing layer and forms an outer surface of the molded body.

In particular, the first sealing layer may seal at least a region that is 25° C. lower than a maximum operating temperature of the semiconductor element when the semiconductor element operates.

In the semiconductor device, the second sealing material may form a first sealing layer that covers the semiconductor element, the insulating substrate, and the printed circuit board and the first sealing material may form a second sealing layer that covers the first sealing layer, faces at least a portion of an outer surface of the molded body, and is provided with a thickness of at least 300 μm.

In particular, the second sealing layer may have a thickness of 3 mm or less.

In the semiconductor device, the first sealing material may form a first sealing layer that covers the semiconductor element and is provided in a region adjacent to the semiconductor element. The second sealing material may form a second sealing layer that covers the first sealing material. The first sealing material may form a third sealing layer that further covers the second sealing layer, faces at least a portion of an outer surface of the molded body, and is provided with a thickness of at least 300 μm.

In particular, the first sealing layer may seal at least a region that is 25° C. lower than a maximum operating temperature of the semiconductor element when the semiconductor element operates. The third sealing layer may have a thickness of 3 mm or less.

In the semiconductor device, the inorganic filler may include at least one of molten silica and crushed silica.

In the semiconductor device, the nanocomposite resin may include 0.1 mass % to 25 mass % of the inorganic filler.

In the semiconductor device, the semiconductor element may be a SiC semiconductor element.

According to the semiconductor device of the invention, a nanocomposite resin is used as one of the sealing materials. Therefore, it is possible to protect, for example, a semiconductor element which is an internal structure of the semiconductor device. In particular, it is possible to suppress the progress of thermal oxidation degradation in a sealing portion of the semiconductor device for a long time, to prevent the occurrence of a crack, and to improve the reliability of the semiconductor device. As a result, the invention can be appropriately used in a semiconductor device using a wide-bandgap semiconductor element, such as a SiC or a GaN semiconductor element.

DETAILED DESCRIPTION OF THE INVENTION

Hereinafter, embodiments of the invention will be described with reference to the drawings. However, the invention is not limited by the following embodiments.
First Embodiment According a first embodiment of the invention, a semiconductor device includes: a molded body that is obtained by sealing, with a sealing material, a member including a semiconductor element, an insulating substrate which is bonded to one surface of the semiconductor element, and a printed circuit board which is used for a connection to an external circuit and is bonded to the other surface of the semiconductor element; and a sealing portion with a two-layer sealing structure in which a first sealing material that is a nanocomposite resin including an epoxy base resin, a curing agent, and an inorganic filler with an average particle size of 1 nm to 100 nm forms a first sealing layer that covers the semiconductor element and is provided in a region adjacent to the semiconductor element and a second sealing material that is a thermosetting resin, a thermoplastic resin, or a mixture thereof forms a second sealing layer that covers the first sealing layer and forms an outer surface of the molded body.

Figure 1:
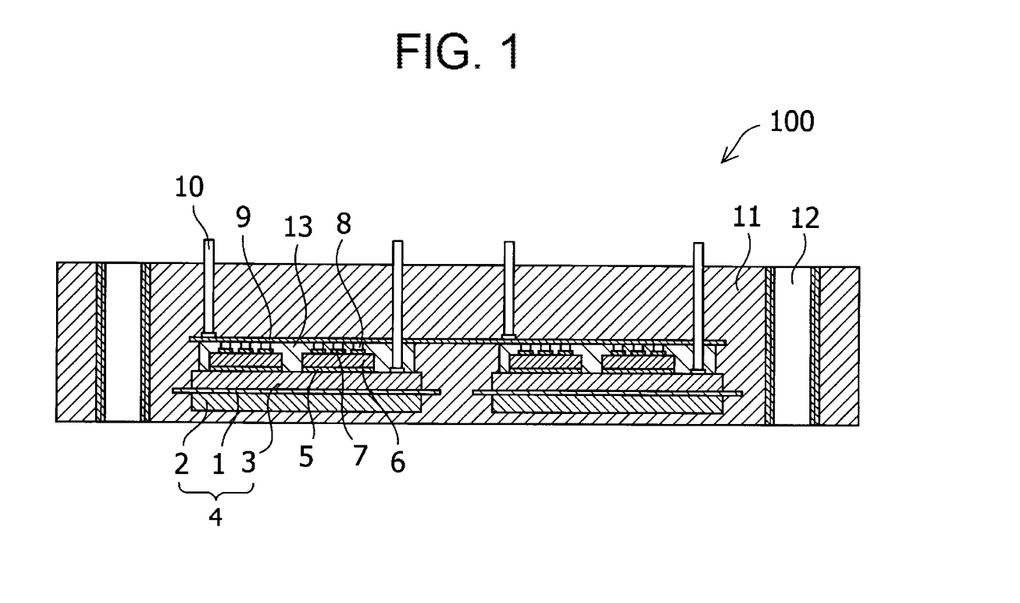
FIG. 1 is a conceptual diagram illustrating the cross-sectional structure of a semiconductor module molded structure according to a first embodiment of the invention.

FIG. 1 is a diagram illustrating the cross-sectional structure of a semiconductor module molded structure 100 which is an example of a semiconductor device according to the first embodiment. In the semiconductor module molded structure 100, an insulating substrate 4 includes a first copper block 2 that has a substantially rectangular parallelepiped shape and is provided on a lower surface which is one surface of an insulating layer 1 and a second copper block 3 that has a substantially rectangular parallelepiped shape and is provided on an upper surface which is the other surface of the insulating layer 1. A plurality of SiC power semiconductor elements 6 are mounted and attached to the upper surface of the insulating substrate 4 close to the second copper block 3, with a conductive bonding layer a5 interposed therebetween. In addition, an implant-type printed circuit board 9 including implant pins 8 is attached to the upper surfaces of the SiC power semiconductor elements 6 by a conductive bonding layer b7. External connection terminals 10 are attached to the upper surface of the implant-type printed circuit board 9 and the upper surface of the second copper block 3 such that an electrical connection to the outside of the semiconductor module molded structure 100 can be made. The periphery of the SiC power semiconductor element 6 is sealed by a first sealing layer made of a nanocomposite resin 13. In addition, the periphery of the first sealing layer is sealed by a second sealing layer made of a resin 11 to form a molded body. In this way, the semiconductor module molded structure 100 is formed. An attachment member 12 which is a bolt insertion hole for attaching the semiconductor module molded structure 100 to a cooler (not illustrated) is buried in the second sealing layer made of the resin 11. In the specification, the upper surface and the lower surface are relative words indicating the top and bottom in the drawings for convenience of description and do not limit the top and bottom in the relationship with, for example, the use aspect of the semiconductor device.

In the semiconductor module molded structure 100 according to this embodiment, a resin-sealed portion is sealed by two types of resins, that is, the nanocomposite resin 13 which is a first sealing material and a thermosetting resin or the thermoplastic resin 11 which is a second sealing material. The nanocomposite resin 13 forms the first sealing layer that directly covers the semiconductor element 6 and is provided in the vicinity of the semiconductor element 6.

The nanocomposite resin 13 includes at least an epoxy base resin, a curing agent, and a nanosized inorganic filler. The glass transition temperature of the nanocomposite resin 13 after curing is equal to or higher than the maximum operating temperature of the semiconductor element 6 and is preferably equal to or higher than 200° C.

It is preferable to use an alicyclic epoxy resin as the epoxy base resin. However, the invention is not limited thereto.

An acid anhydride-based curing agent is used as the curing agent. Examples of the acid anhydride-based curing agent include methyltetrahydrophthalic anhydride, tetrahydrophthalic anhydride, methylnadic anhydride, Hexahydrophthalic anhydride, methylhexahydrophthalic anhydride, isomers thereof, and modifications thereof. However, the invention is not limited thereto. In addition, as the acid anhydride-based curing agent, one kind of material among the above-mentioned materials can be independently used or a mixture of two kinds of materials can be used.

A so-called nanofiller which has an average particle size of 1 nm to 100 nm, preferably, 5 nm to 50 nm is used as the inorganic filler in order to improve the heat resistance of the resin. In the specification, the average particle size means a value which is measured by a laser diffraction scattering method. A compound forming the inorganic filler may be at least one selected from a group consisting of $SiO_2$, BN, $Al_2O_3$, AlN, and $Si_3N_4$. However, the invention is not limited thereto.

Preferably, at least a portion of the inorganic filler is made of $SiO_2$. More preferably, the entire inorganic filler is made of $SiO_2$. In addition, molten silica or/and crushed silica can be used in $SiO_2$. In particular, the molten silica has the advantage that a relatively large amount of molten silica can be added while suppressing an excessive increase in viscosity.

The amount of inorganic filler added to the nanocomposite resin is preferably in the range of 0.1 mass % to 25 mass % and more preferably in the range of 1 mass % to 15 mass % when the total mass of the nanocomposite resin is 100% in terms of heat resistance characteristics and viscosity characteristics.

A curing aid may be added as an optional component, in addition to the curing agent, in order to control a curing reaction. Examples of the curing aid include an imidazole-based material, such as 2-ethyl-4-methylimidazole, a tertiary amine-based material, such as benzyldimethylamine, an aromatic phosphine-based material, such as triphenyl phosphine, Lewis acid, such as boron trifluoride monoethyl amine, borate ester, an organic metal compound, and organic acid metal salt. However, the invention is not limited thereto.

In addition, the nanocomposite resin 13 may include an optional component which is generally added to a semiconductor sealing resin. Examples of the optional component include a flame retardant, a pigment for coloring a resin, a plasticizing agent for improving crack resistance, and silicon elastomer. However, the invention is not limited thereto. The operator can appropriately determine the amount of optional component added according to the specifications of the semiconductor device.

Preferably, the first sealing layer made of the nanocomposite resin 13 completely covers the entire surface of the semiconductor element 6 and is provided in a region that is 25° C. to 30° C. lower than the maximum operating temperature from the maximum operating temperature of the semiconductor element 6 in the resin-sealed portion. This is because the resin-sealed portion around the semiconductor element 6 is exposed to a high temperature during operation. When the specifications of the semiconductor element are determined, it is possible to calculate the temperature of the resin-sealed portion during operation using general-purpose simulation software. Therefore, the first sealing layer is provided so as to seal at least a region in which the temperature of the resin-sealed portion calculated by a simulation is 25° C., preferably, 30° C. lower than the maximum operating temperature from the maximum operating temperature of the semiconductor element 6. For example, when the maximum operating temperature of the semiconductor element 6 is 200° C., the first sealing layer seals a region in which the temperature of the resin-sealed portion calculated by a simulation is 175° C. to 200° C. In the semiconductor module molded structure with general specifications, the nanocomposite resin 13 is provided in a region that is about 1 mm away from the periphery of the semiconductor element 6 to seal the region having the above-mentioned temperature with the first sealing layer. Alternatively, the nanocomposite resin 13 is provided in a region between the semiconductor element 6 and the printed circuit board and a region that is about 1 mm away from the periphery of the semiconductor element 6 in the thickness direction to seal the region having the above-mentioned temperature with the first sealing layer.

Then, the thermosetting resin or the thermoplastic resin 11 which is the second sealing material covers the first sealing layer made of the first sealing material to form most of the resin-sealed portion and to form the second sealing layer defining the outer surface of the molded body. In addition, the first sealing layer is not necessarily covered with the second sealing layer. The first sealing layer made of the nanocomposite resin 13 may be partially exposed from the outer surface of the molded body.

The resin 11 is a thermosetting resin or a thermoplastic resin which may include an inorganic filler or may not include the inorganic filler or a mixture thereof. The resin 11 can be determined by the relationship with the nanocomposite resin 13. That is, it is preferable that the difference between the thermal expansion coefficients of the resin 11 and the nanocomposite resin 13 be in the range of ±10 ppm/° C. in order to reduce thermal stress after sealing. In addition, it is preferable that the adhesion strength of the resin 11 to the nanocomposite resin 13 be equal to or greater than 10 MPa in order to prevent a crack from occurring in the interface between the resin 11 and the nanocomposite resin 13 after sealing. Any type of resin may be used as the resin 11 as long as it satisfies these conditions. For example, an epoxy resin or a polyamide resin which is generally used to seal the semiconductor device may be used as the resin 11. The resin 11 which is the second sealing material may be a nanocomposite resin, similarly to the first sealing material, as long as it satisfies the conditions of the above-mentioned thermal expansion coefficient characteristics or adhesion characteristics. In this embodiment, in particular, the second sealing layer covers the outer surface of the molded body to form an outer circumferential portion and is exposed to an external atmosphere. Therefore, it is preferable to use a thermosetting resin which is less likely to be degraded by oxidation.

In the semiconductor module molded structure 100 according to the first embodiment illustrated in FIG. 1, a surface of the first copper block 2 which is opposite to the insulating layer 1, that is, a lower surface of the first copper block 2 in FIG. 1 comes into contact with the resin 11, is covered with the resin 11, and is not exposed to the outside. However, the invention is not limited to this structure. A portion of or the entire lower surface of the first copper block 2 may be exposed and connected to, for example, a cooling member (not illustrated). FIG. 1 is a conceptual diagram and the positional relationship between the first sealing layer made of the nanocomposite resin 13 illustrated in FIG. 1 and other members is not necessarily the same as that illustrated in FIG. 1. In addition, the structure of the insulating substrate 4, the printed circuit board 9, and the implant pin 8 is not limited to that illustrated in FIG. 1.

Next, the semiconductor module molded structure 100 according to the first embodiment will be described in terms of a manufacturing method. A method for manufacturing the SiC power semiconductor module molded structure 100 mainly includes a process of assembling a member obtained by bonding the insulating substrate 4, the semiconductor element 6, and the printed circuit board 9 and a process of sealing the member with a resin.

The process of assembling the member obtained by bonding the insulating substrate 4, the semiconductor element 6, and the printed circuit board 9 includes a process of sticking the first copper block 2 and the second copper block 3 to both surfaces of the insulating layer 1 using thermal compression bonding to form the insulating substrate 4, a process of mounting one or more SiC power semiconductor elements 6 on one surface of the insulating substrate 4 with the conductive bonding layer a5, a process of attaching the implant-type printed circuit board 9 including the implant pins 8 to a surface of the SiC power semiconductor element 6, which is opposite to the insulating substrate 4, with the conductive bonding layer b7, and a process of connecting the external connection terminals 10 to the second copper block 3 and the printed circuit board 9.

For example, the assembly process and the specifications of the members used may be based on the general method according to the related art. For example, each process other than the resin sealing process described in JP 2013-004729 A or JP 2012-191010A of the applicant can be applied.

The resin sealing process includes a first sealing process of forming the first sealing layer using the nanocomposite resin 13 and a second sealing process of forming the second sealing layer using the resin 11.

In the first sealing process, the nanocomposite resin 13 which has not been cured is vacuum-degassed under general conditions and is then injected around the semiconductor element 6 by, for example, a dispenser or is applied by an arbitrary means to cover the periphery of the semiconductor element 6, thereby forming the first sealing layer. At that time, the viscosity of the nanocomposite resin is adjusted to a predetermined value, for example, about 1 to 10 Pa·s to adjust the thickness of the portion sealed with the nanocomposite resin to a predetermined value. For example, a desired position where the nanocomposite resin is placed can be surrounded by a Teflon (registered trademark) jig to adjust the thickness of the first sealing layer to the value obtained by the above-mentioned simulation. Then, the nanocomposite resin 13 is thermally cured under the conditions of a predetermined temperature and a predetermined period of time, for example, a temperature of 100° C. to 200° C. for 1 to 3 hours. In this way, the first sealing process is completed.

In the second sealing process, the resin 11 which has been vacuum-degassed under general conditions is applied around the first sealing layer obtained by the first sealing process and is formed in a predetermined shape corresponding to the outer shape of the molded body by a molding method, such as transfer molding, liquid transfer molding, potting, or injection molding. In this way, the second sealing layer is formed. Then, the resin 11 is thermally cured under the conditions of a predetermined temperature and a predetermined period of time, for example, at a temperature of 100° C. to 200° C. for 1 to 3 hours, while being potted. In this way, the second sealing process is completed. When the resin 11 is a thermoplastic resin, the thermally curing process is not performed. As such, it is possible to obtain a molded body including a resin-sealed portion with a two-layer sealing structure which is doubly sealed with the nanocomposite resin 13 and the resin 11, using the first sealing process and the second sealing process. In addition, when the second sealing layer of the molded body is formed, a process of forming a hole into which the attachment member 12 is inserted in the second sealing layer and inserting the attachment member 12 into the hole after the second sealing layer is cured is performed. In this way, it is possible to obtain the semiconductor module molded structure 100.

In addition, the second sealing process performed by the liquid transfer molding which is an example of the molding method will be described in detail. In a detailed sealing method for the SiC power semiconductor module 200, the member which is obtained by bonding the insulating substrate 4, the semiconductor element 6, and the printed circuit board 9 and is covered with the first sealing layer is accommodated in a cavity that is formed by the upper and lower molds (not illustrated) for liquid transfer molding and is maintained at a molding temperature of 160° C. A sealing material potting portion and a runner portion are provided in the upper and lower molds for transfer molding.

The first sealing material which is the liquid nanocomposite resin 13 including an alicyclic epoxy resin, an acid anhydride curing agent, and an inorganic filler is produced and primary degassing is performed on the first sealing material for 10 minutes in a vacuum of 0.1 Torr (13.33 Pa). Then, the first sealing material is put into a cylinder container. A necessary amount of first sealing material is poured from the cylinder container to the potting portion of the molds. Then, the upper and lower molds are clamped. Finally, the first sealing material is poured from the potting portion to the cavity of the molds through the runner portion and molding is completed. The molding conditions can be as follows: the clamping force of the upper and lower molds is 150 kg/cm$^2$; the gelling time at 160° C. is 1 minute; the curing time is 3 minutes; and the viscosity of the first sealing material made of the nanocomposite resin 13 is about 1 Pa·s to 10 Pa·s.

According to the semiconductor module molded structure 100 and the method for manufacturing the same of the first embodiment, it is possible to provide the semiconductor module molded structure 100 which is less likely to be thermally degraded even when the semiconductor element having the maximum operating temperature of about 200° C. is used and has high durability. In particular, this embodiment has the advantage that, when a wide-bandgap semiconductor, such as SiC or GaN, is used, it is possible to improve the heat resistance of the resin-sealed portion, which is arranged in the vicinity of the semiconductor element with a high operating temperature, with the nanocomposite resin.

Second Embodiment

According to a second embodiment of the invention, a semiconductor device includes a molded body that is obtained by sealing, with a sealing material, a member including a semiconductor element, an insulating substrate which is bonded to one surface of the semiconductor element, and a printed circuit board which is used for a connection to an external circuit and is bonded to the other surface of the semiconductor element. A second sealing material which is a thermosetting resin or a thermoplastic resin forms a first sealing layer that covers the semiconductor element. A first sealing material which is a nanocomposite resin forms a second sealing layer that covers the first sealing layer, faces at least a portion of an outer surface of the molded body, and is provided with at least a thickness of 300 μm.

Figure 2:
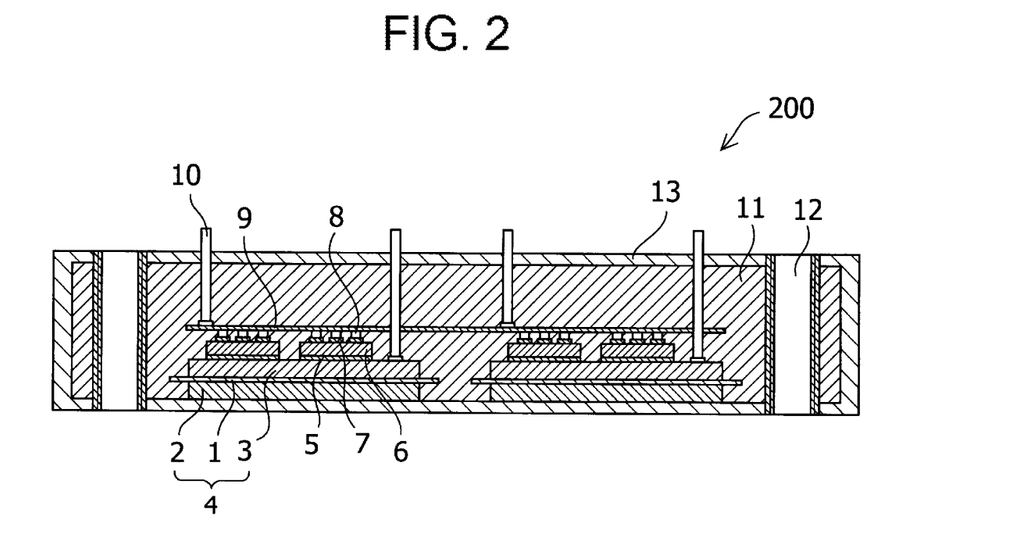
FIG. 2 is a conceptual diagram illustrating the cross-sectional structure of a semiconductor module molded structure according to a second embodiment of the invention.

FIG. 2 is a diagram illustrating the cross-sectional structure of a semiconductor module molded structure 200 which is an example of a semiconductor device according to the second embodiment. In the semiconductor module molded structure 200, an insulating substrate 4, a semiconductor element 6, an implant-type printed circuit board 9 including implant pins 8, and an external connection terminal 10 have the same structure as those in the first embodiment illustrated in FIG. 1. The same members are denoted by the same reference numerals and the description thereof will not be repeated.

In the semiconductor module molded structure 200 according to this embodiment, a resin-sealed portion is sealed by two types of resins, that is, a nanocomposite resin 13 which is a first sealing material and a thermosetting resin or a thermoplastic resin 11 which is a second sealing material. The resin 11 forms a first sealing layer that directly covers the insulating substrate 4, the semiconductor element 6, the printed circuit board 9, and the bonded interfaces thereof and occupies most of the sealing portion. The nanocomposite resin 13 forms a second sealing layer that covers the first sealing layer and defines the outer shape of the molded body. The second sealing layer is an outer circumferential portion of the molded body and is preferably formed with a substantially uniform thickness of at least 300 μm in order to prevent the oxidation degradation of the resin-sealed portion due to the external atmosphere of the semiconductor device. The thickness of the second sealing layer is in the range of, for example, 300 μm to 3 mm and preferably in the range of 300 μm to 1 mm.

The composition of each of the nanocomposite resin 13 and the resin 11 and the preferred combination of the nanocomposite resin 13 and the resin 11 are the same as those described in the first embodiment.

In the semiconductor module molded structure 200 according to the second embodiment illustrated in FIG. 2, a portion of or the entire lower surface of a first copper block 2 may be exposed and connected to, for example, a cooling member (not illustrated). In addition, the nanocomposite resin 13 may cover the entire outer circumference of the semiconductor module molded structure 200. For example, the nanocomposite resin 13 may be provided only on the surface whose outer circumference is exposed to a high-temperature atmosphere, according to the purpose of use of the semiconductor module molded structure 200. In addition, the structure of the insulating substrate 4, the implant-type printed circuit board 9, and the implant pin 8 is not limited to that illustrated in FIG. 2 and can be changed.

Next, the semiconductor module molded structure 200 according to the second embodiment will be described in terms of a manufacturing method. A method for manufacturing a SiC power semiconductor module molded structure mainly includes a process of assembling a member obtained by bonding the insulating substrate 4, the semiconductor element 6, and the printed circuit board 9 and a process of sealing the member with a resin. The process of assembling the member is the same as that in the first embodiment and is performed by the same method as that in the first embodiment.

The resin sealing process includes a first sealing process of forming the first sealing layer using the resin 11 and a second sealing process of forming the second sealing layer using the nanocomposite resin 13.

In the first sealing process, the member obtained by bonding the insulating substrate 4, the semiconductor element 6, and the printed circuit board 9 is sealed with the resin 11 which has been vacuum-degassed in advance by a general method. The sealing is performed by molding the member in a predetermined shape using a molding method such as transfer molding, liquid transfer molding, or injection molding. Then, the resin 11 is thermally cured under the conditions of a predetermined temperature and a predetermined period of time, for example, at a temperature of 100° C. to 180° C. for 1 to 10 minutes to form the first sealing layer. In this way, the first sealing process is completed. For example, the first sealing process according to this embodiment can be performed by the process and procedure of the liquid transfer molding method which has been described in detail in the second sealing process according to the first embodiment. When the resin 11 is a thermoplastic resin, the first sealing process can be performed by the same method as that in the first embodiment except for the thermally curing process.

In the second sealing process, the nanocomposite resin 13 which has been vacuum-degassed in advance by a general method is applied with a predetermined thickness to at least a portion of the outer circumference of the molded body obtained by the first sealing process by, for example, a coating, molding, or potting method to cover the portion. Then, the nanocomposite resin 13 is thermally cured under the conditions of a predetermined temperature and a predetermined period of time, for example, at a temperature of 100° C. to 200° C. for 1 to 3 hours, while being potted, to form the second sealing layer. In this way, the second sealing process is completed. As such, it is possible to obtain a molded body including a resin-sealed portion with a two-layer sealing structure which is doubly sealed with the resin 11 and the nanocomposite resin 13, using the first sealing process and the second sealing process. In addition, when the first sealing layer of the molded body is formed, a process of forming a hole into which an attachment member 12 is inserted in the first sealing layer and inserting the attachment member 12 into the hole after the first and second sealing layers are cured is performed. In this way, it is possible to obtain the semiconductor module molded structure 200.

According to the semiconductor module molded structure 200 and the method for manufacturing the same of the second embodiment, it is possible to protect a semiconductor device which is used at a high temperature from oxidation degradation for a long time. In addition, it is possible to prevent the oxidation degradation of the material used, as compared to the related art. Therefore, it is possible to reduce the size of a module structure and to improve the reliability of the semiconductor device. In addition, it is possible to reduce Costs.

Third Embodiment

According to a third embodiment of the invention, a semiconductor device includes a molded body that is obtained by sealing, with a sealing material, a member including a semiconductor element, an insulating substrate which is bonded to one surface of the semiconductor element, and a printed circuit board which is used for a connection to an external circuit and is bonded to the other surface of the semiconductor element. A first sealing material which is a nanocomposite resin forms a first sealing layer that covers the semiconductor element and is provided in a region adjacent to the semiconductor element. A second sealing material which is a thermosetting resin or a thermoplastic resin forms a second sealing layer that covers the first sealing material. The first sealing material which is the nanocomposite resin forms a third sealing layer that further covers the second sealing material, faces at least a portion of an outer surface of the molded body, and is provided with at least a thickness of 300 µm.

Figure 3:
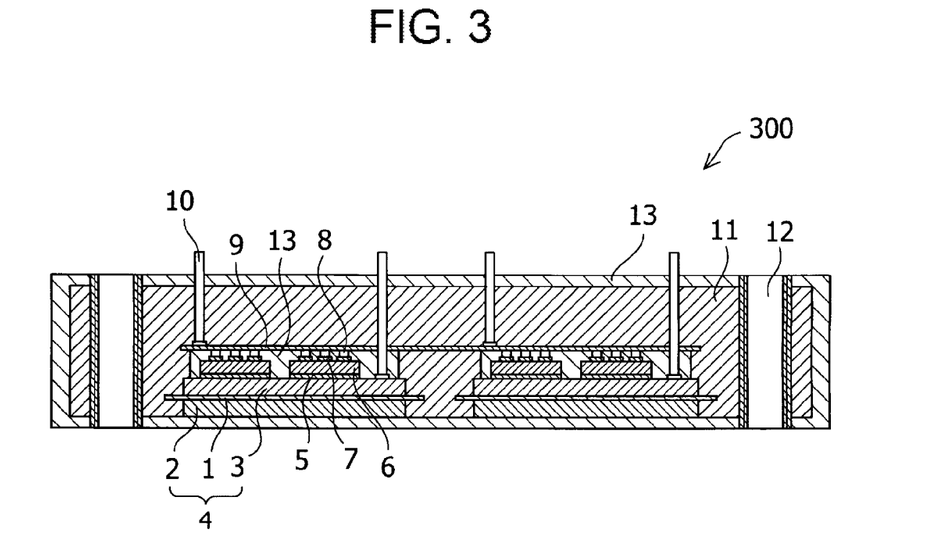
FIG. 3 is a conceptual diagram illustrating the cross-sectional structure of a semiconductor module molded structure according to a third embodiment of the invention.

FIG. 3 is a diagram illustrating the cross-sectional structure of a semiconductor module molded structure 300 which is an example of a semiconductor device according to the third embodiment. In the semiconductor module molded structure 300, an insulating substrate 4, a semiconductor element 6, an implant-type printed circuit board 9 including implant pins 8, and an external connection terminal 10 have the same structure as those in the first embodiment illustrated in FIG. 1. The same members are denoted by the same reference numerals and the description thereof will not be repeated.

In the semiconductor module molded structure 300 according to this embodiment, a resin-sealed portion has a three-layer sealing structure that is triply sealed by two types of resins, that is, a nanocomposite resin 13 which is a first sealing material and a thermosetting resin, a thermoplastic resin, or a mixture 11 thereof which is a second sealing material. In FIG. 3, the first sealing layer made of the nanocomposite resin 13 covers the semiconductor element 6 and is provided in the vicinity of the semiconductor element 6. The aspect of the first sealing layer is the same as that of the first sealing layer in the first embodiment. The second sealing material which is the resin 11 covers the periphery of the first sealing layer to form the second sealing layer. In addition, the nanocomposite resin 13 covers the periphery of the second sealing layer to form the third sealing layer with a substantially uniform thickness of at least 300 µm in the outer circumference of the molded body. The thickness of the third sealing layer is in the range of, for example, 300 µm to 3 mm and preferably in the range of 300 µm to 1 mm.

The composition of each of the nanocomposite resin 13 and the resin 11 and the preferred combination of the nanocomposite resin 13 and the resin 11 are the same as those described in the first embodiment. In this embodiment, the nanocomposite resin forming the first sealing layer may be the same as or different from the nanocomposite resin forming the third sealing layer.

In the semiconductor module molded structure 300 according to the third embodiment illustrated in FIG. 3, the entire surface of a first copper block 2 which is opposite to an insulating layer 1, that is, the entire lower surface of the first copper block 2 in FIG. 3 may be exposed and connected to, for example, a cooling member (not illustrated). In addition, the third sealing layer may not cover the entire outer circumference of the semiconductor module molded structure 300. For example, in particular, the third sealing layer may be provided only on a surface whose outer circumference is exposed to a high-temperature atmosphere. The structure of the insulating substrate 4, the implant-type printed circuit board 9, and the implant pin 8 is not limited to that illustrated in FIG. 3 and can be changed.

Next, the semiconductor module molded structure 300 according to the third embodiment will be described in terms of a manufacturing method. A method for manufacturing the SiC power semiconductor module molded structure 300 mainly includes a process of assembling a member obtained by bonding the insulating substrate 4, the semiconductor element 6, and the printed circuit board 9 and a process of sealing the member with a resin. The process of assembling the member is the same as that in the first embodiment and is performed by the same method as that in the first embodiment.

The resin sealing process includes a first sealing process of forming the first sealing layer using the nanocomposite resin 13, a second sealing process of forming the second sealing layer using the resin 11, and a third sealing process of forming the third sealing layer using the nanocomposite resin 13.

The first sealing process according to this embodiment can be performed by the same method as that in the first sealing process according to the first embodiment.

In the second sealing process, the resin 11 is applied around the first sealing layer obtained by the first sealing process and is molded in a predetermined shape by a molding method, such as transfer molding, liquid transfer molding, or potting. Then, the resin 11 is thermally cured under the conditions of a predetermined temperature and a predetermined period of time, for example, at a temperature of 100° C. to 200° C. for 1 to 3 hours, while being potted, to form the second sealing layer. In this way, the second sealing process is completed. For example, the second sealing process according to this embodiment can be performed by the process and procedure of the liquid transfer molding method which has been described in detail in the second sealing process according to the first embodiment. When the resin 11 is a thermoplastic resin, the second sealing process can be performed by the same method as that in the first embodiment except for the thermally curing process.

In the third sealing process, the nanocomposite resin 13 is applied with a predetermined thickness to the outer circumference of the second sealing layer obtained by the second sealing process by, for example, a coating, molding, or potting method so as to cover the second sealing layer. Then, the nanocomposite resin 13 is thermally cured under the conditions of a predetermined temperature and a predetermined period of time, for example, at a temperature of 100° C. to 200° C. for 1 to 3 hours to form the third sealing layer. In this way, the third sealing process is completed. As such, it is possible to obtain a molded structure including a resin-sealed portion with a three-layer sealing structure that is triply sealed with the nanocomposite resin 13 and the resin 11 which are alternately provided, using the first to third second sealing processes. In addition, when the second sealing layer of the molded body is formed, a process of forming a hole into which an attachment member 12 is inserted in the second sealing layer and inserting the attachment member 12 into the hole after all of the first to third sealing layers are cured is performed. In this way, it is possible to obtain the semiconductor module molded structure 300.

According to the semiconductor module molded structure 300 and the method for manufacturing the same of the third embodiment, both the periphery of the semiconductor element 6 which is likely to reach a high temperature during operation and the outer circumference of the semiconductor module molded structure 300 which is likely to be degraded by oxidation are sealed with the nanocomposite resin 13 with high heat resistance. Therefore, the periphery of a semiconductor element with a high operating temperature is less likely to be thermally degraded and the outer circumferential surface of a semiconductor module which is used in a high-temperature atmosphere is less likely to be degraded by oxidation. As a result, it is possible to provide a semiconductor module molded structure with high durability.

Next, the invention will be described in detail with reference to examples. The following examples are illustrative examples of the invention and do not limit the invention.

EXAMPLES

As described in the second embodiment, the SiC power semiconductor module molded structure 200 illustrated in FIG. 2 was assembled. The composition of an epoxy resin used as the sealing material is illustrated in Table 1. In all of sample numbers 1 to 4, an alicyclic epoxy resin was used as the base compound and an acid anhydride-based curing agent was used as the curing agent. A curing aid or other optional components were not included. In sample number 3, an inorganic filler included 2 wt % of silica with an average particle size of 10 nm. In sample number 4, an inorganic filler included 15 wt % of silica with an average particle size of 10 nm. In the resin of sample number 1, no inorganic filler was used. In sample number 2, an inorganic filler included 83 wt % of silica with an average particle size of 20 μm, that is, microsized silica.

Flexural test pieces were produced using the sealing materials of sample numbers 1 to 4 and a flexural strength retention rate after a thermal degradation test was measured. The flexural test piece with a size of 4 mm×6 mm×70 mm was produced. The test conditions were as follows: the flexural test pieces were left in the atmosphere at 200° C. for 100 hours, 1000 hours, and 10000 hours. Then, the flexural test was performed to calculate the retention rate. The flexural strength retention rate was a value obtained by multiplying a fraction having an initial flexural strength as the denominator and flexural strength after the thermal degradation test as the numerator by 100.

The results of the flexural test are illustrated in Table 2. In the sealing materials of sample numbers 1 and 2, the flexural strength retention rates after 10000 hours were 28% and 34%. In contrast, in the test piece using the sealing material of sample number 3, the retention rate after 10000 hours was reduced to 47%. In the test piece using the sealing material of sample number 4 in which the amount of nanosized inorganic filler was more than that in the sealing material of sample number 3, it was possible to further suppress a reduction in the retention rate and the retention rate was 61%.

The results of a color change from the surface of the resin after the thermal degradation test for the sealing material are illustrated in Table 2. The length of the color change from the surface to the inside increased with the thermal degradation time. After the flexural test pieces were left in the atmosphere at 200° C. for 10000 hours, the length of the color change was 850 μm in sample number 1, was 700 μm in sample number 2, was 420 μm in sample number 3, and 320 μm in sample number 4. The results proved that the addition of the nanofiller made it possible to suppress an increase in the length of the color change.

In the sealing materials of sample numbers 1 to 4, the thermal degradation test was performed to examine whether a crack occurred. The test conditions were as follows: the test pieces were left at 200° C. for 1000 hours and it was visually checked whether a crack occurred. In the sealing materials of sample numbers 1 and 2, a crack occurred due to the thermal degradation test. In contrast, in the test pieces using the sealing materials of sample numbers 3 and 4, no crack occurred in a surface layer.

TABLE 1

| Sample No. | 1 | 2 | 3 | 4 |
|---|---|---|---|---|
| Base compound | Alicyclic epoxy resin | | | |
| Curing agent | Acid anhydride curing agent | | | |
| Average particle size of filler | — | 20 μm | 10 nm | 10 nm |
| Amount of filler added | — | 83 mass % | 2 mass % | 15 mass % |
| Glass transition temperature after curing | | | | 265° C. |
| Presence or absence of crack | Present | Present | Absent | Absent |

TABLE 2

| | Sample No. | | | | | | | | | | | |
|---|---|---|---|---|---|---|---|---|---|---|---|---|
| | 1 | | | 2 | | | 3 | | | 4 | | |
| Time (h) | $10^2$ | $10^3$ | $10^4$ | $10^2$ | $10^3$ | $10^4$ | $10^2$ | $10^3$ | $10^4$ | $10^2$ | $10^3$ | $10^4$ |
| Flexural strength retention rate (%) | 59 | 45 | 28 | 60 | 50 | 34 | 62 | 55 | 47 | 67 | 65 | 61 |
| Length of color change (μm) | 180 | 450 | 850 | 150 | 350 | 700 | 130 | 260 | 420 | 100 | 220 | 320 |

INDUSTRIAL APPLICABILITY

The semiconductor device according to the invention is useful in a power semiconductor module that uses a semiconductor element, such as SiC or GaN, and operates at a high temperature.

EXPLANATIONS OF LETTERS OR NUMERALS

1 INSULATING LAYER
2 FIRST COPPER BLOCK
3 SECOND COPPER BLOCK
4 INSULATING SUBSTRATE
5a CONDUCTIVE BONDING LAYER
6 SIC SEMICONDUCTOR ELEMENT
7b CONDUCTIVE BONDING LAYER
8 IMPLANT PIN
9 IMPLANT-TYPE PRINTED CIRCUIT BOARD
11 RESIN
12 ATTACHMENT MEMBER
13 NANOCOMPOSITE RESIN
100 SEMICONDUCTOR MODULE MOLDED STRUCTURE
200 SEMICONDUCTOR MODULE MOLDED STRUCTURE
300 SEMICONDUCTOR MODULE MOLDED STRUCTURE

What is claimed is:

1. A semiconductor device, comprising:
a molded body that is obtained by sealing, with a sealing material, a member including a semiconductor element, an insulating substrate which is bonded to one surface of the semiconductor element, and a printed circuit board which is used for a connection to an external circuit and is bonded to the other surface of the semiconductor element,
wherein the sealing material includes:
a first sealing material which is a nanocomposite resin including an epoxy base resin, a curing agent, and an inorganic filler with an average particle size of 1 nm to 100 nm; and
a second sealing material which is a thermosetting resin, a thermoplastic resin, or a mixture thereof,
wherein the first sealing material forms a first sealing layer that covers the semiconductor element and is provided in a region adjacent to the semiconductor element, and the second sealing material forms a second sealing layer that covers the first sealing layer and optionally forms an outer surface of the molded body.

2. The semiconductor device according to claim 1, wherein the semiconductor element has a maximum operating temperature, and wherein the first sealing layer seals at least a region that is 25° C. lower than the maximum operating temperature of the semiconductor element when the semiconductor element operates.

3. A semiconductor device, comprising:
a molded body that is obtained by sealing, with a sealing material, a member including a semiconductor element, an insulating substrate which is bonded to one surface of the semiconductor element, and a printed circuit board which is used for a connection to an external circuit and is bonded to the other surface of the semiconductor element,
wherein the sealing material includes:
a first sealing material which is a nanocomposite resin including an epoxy base resin, a curing agent, and an inorganic filler with an average particle size of 1 nm to 100 nm; and
a second sealing material which is a thermosetting resin, a thermoplastic resin, or a mixture thereof,
wherein the second sealing material forms a first sealing layer that covers the semiconductor element, the insulating substrate, and the printed circuit board, and wherein the first sealing material forms a second sealing layer that covers the first sealing layer, faces at least a portion of an outer surface of the molded body, and is provided with a thickness of at least 300 µm.

4. The semiconductor device according to claim 3, wherein the second sealing layer has a thickness of 3 mm or less.

5. A semiconductor device, comprising:
a molded body that is obtained by sealing, with a sealing material, a member including a semiconductor element, an insulating substrate which is bonded to one surface of the semiconductor element, and a printed circuit board which is used for a connection to an external circuit and is bonded to the other surface of the semiconductor element,
wherein the sealing material includes:
a first sealing material which is a nanocomposite resin including an epoxy base resin, a curing agent, and an inorganic filler with an average particle size of 1 nm to 100 nm; and
a second sealing material which is a thermosetting resin, a thermoplastic resin, or a mixture thereof,
wherein the first sealing material forms a first sealing layer that covers the semiconductor element and is provided in a region adjacent to the semiconductor element, wherein the second sealing material forms a second sealing layer that covers the first sealing material, and wherein the first sealing material forms a third sealing layer that further covers the second sealing layer, faces at least a portion of an outer surface of the molded body, and is provided with a thickness of at least 300 µm.

6. The semiconductor device according to claim 5, wherein the semiconductor element has a maximum operating temperature, wherein the first sealing layer seals at least a region that is 25° C. lower than a maximum operating temperature of the semiconductor element when the semiconductor element operates, and wherein the third sealing layer has a thickness of 3 mm or less.

7. The semiconductor device according to claim 1, wherein the inorganic filler includes at least one of molten silica and crushed silica.

8. The semiconductor device according to claim 1, wherein the nanocomposite resin includes 0.1 mass % to 25 mass % of the inorganic filler.

9. The semiconductor device according to claim 1, wherein the semiconductor element is a SiC semiconductor element.

10. A semiconductor device, comprising:
a member including a semiconductor element, an insulating substrate which is bonded to one surface of the semiconductor element, and a printed circuit board which is used for a connection to an external circuit and is bonded to another surface of the semiconductor element; and
a sealing member provided around the member to seal the member and provide a molded body, the sealing member including a plurality of layers comprised of respective sealing material including:
a first sealing material which is a nanocomposite resin including an epoxy base resin, a curing agent, and an inorganic filler having an average particle size ranging from 1 nm to 100 nm; and
a second sealing material which is a thermosetting resin, a thermoplastic resin, or a mixture thereof,
wherein the plurality of layers includes:
a first sealing layer formed of the first sealing material that covers the semiconductor element and is provided in a region adjacent to the semiconductor element; and
a second sealing layer formed of the second sealing material that covers the first sealing layer and optionally forms an outer surface of the molded body.

11. The semiconductor device according to claim 10, wherein the semiconductor element has a maximum operating temperature, and wherein the first sealing layer seals at least a region that has an operating temperature that is 25° C. lower than the maximum operating temperature of the semiconductor element when the semiconductor element operates.

12. A semiconductor device, comprising:
a member including a semiconductor element, an insulating substrate which is bonded to one surface of the semiconductor element, and a printed circuit board which is used for a connection to an external circuit and is bonded to another surface of the semiconductor element; and
a sealing member provided around the member to seal the member and provide a molded body, the sealing member including a plurality of layers comprised of respective sealing material including:
a first sealing material which is a nanocomposite resin including an epoxy base resin, a curing agent, and an inorganic filler having an average particle size ranging from 1 nm to 100 nm; and
a second sealing material which is a thermosetting resin, a thermoplastic resin, or a mixture thereof,
wherein the plurality of layers includes:
a first sealing layer formed of the second sealing material that covers the semiconductor element, the insulating substrate, and the printed circuit board; and
a second sealing layer formed of the first sealing material that covers the first sealing layer, that faces at least a portion of an outer surface of the molded body, and that has a thickness of at least 300 µm.

13. The semiconductor device according to claim 12, wherein the second sealing layer has a thickness of 3 mm or less.

14. A semiconductor device, comprising:
a member including a semiconductor element, an insulating substrate which is bonded to one surface of the semiconductor element, and a printed circuit board which is used for a connection to an external circuit and is bonded to another surface of the semiconductor element; and
a sealing member provided around the member to seal the member and provide a molded body, the sealing member including a plurality of layers comprised of respective sealing material including:
a first sealing material which is a nanocomposite resin including an epoxy base resin, a curing agent, and an inorganic filler having an average particle size ranging from 1 nm to 100 nm; and
a second sealing material which is a thermosetting resin, a thermoplastic resin, or a mixture thereof,
wherein the plurality of layers further includes:
a first sealing layer formed of the first sealing material that covers the semiconductor element and is provided in a region adjacent to the semiconductor element; a second sealing layer formed of the second sealing material that covers the first sealing material; and a third sealing layer formed of the first sealing material that further covers the second sealing layer, that faces at least a portion of an outer surface of the molded body, and that has a thickness of at least 300 µm.

15. The semiconductor device according to claim 14, wherein the semiconductor element has a maximum operating temperature, wherein the first sealing layer seals at least a region that has an operating temperature that is 25° C. lower than the maximum operating temperature of the semiconductor element when the semiconductor element operates, and wherein the third sealing layer has a thickness of 3 mm or less.

16. The semiconductor device according to claim 10, wherein the inorganic filler includes at least one of molten silica and crushed silica.

17. The semiconductor device according to claim 10, wherein the nanocomposite resin includes from 0.1 mass % to 25 mass % of the inorganic filler.

18. The semiconductor device according to claim 10, wherein the semiconductor element is a SiC semiconductor element.

\* \* \* \* \*